United States Patent [19]

Ando et al.

[11] 3,836,906

[45] Sept. 17, 1974

[54] DIGITAL-TO-ANALOG CONVERTER CIRCUIT

[75] Inventors: Tetsuo Ando, Ebina; Hiroyuki Matsumoto, Isehara, both of Japan

[73] Assignee: Sony Corporation, Tokyo, Japan

[22] Filed: Feb. 28, 1973

[21] Appl. No.: 336,817

[30] Foreign Application Priority Data

Mar. 2, 1972 Japan .............................. 47-21874

[52] U.S. Cl. .......................................... 340/347 DA
[51] Int. Cl. .......................................... H03k 13/04
[58] Field of Search ............... 340/347 AD, 347 DA

[56] References Cited

UNITED STATES PATENTS

| | | | |
|---|---|---|---|
| 2,889,549 | 6/1959 | Caughey | 340/347 DA |
| 3,056,085 | 9/1962 | James et al. | 340/347 AD X |
| 3,325,802 | 6/1967 | Bacon | 340/347 DA X |
| 3,594,782 | 7/1971 | Carbrey | 340/347 DA |
| 3,646,587 | 2/1972 | Shaffstall et al. | 340/347 DA |
| 3,651,518 | 3/1972 | Carbrey | 340/347 DA |
| 3,665,458 | 5/1972 | Mulkey et al. | 340/347 DA |

OTHER PUBLICATIONS

Lincoln, IEEE Transactions on Computers, Oct. 1968, pp. 999–1,000.

*Primary Examiner*—Charles D. Miller
*Attorney, Agent, or Firm*—Lewis H. Eslinger, Esq.; Alvin Sinderbrand, Esq.

[57] ABSTRACT

A circuit for converting binary-coded number signals into analog voltages. The 1 and 0 voltage levels of the binary signals are applied through individual switching means to charge separate charge storage elements, the quantity of charge being weighted according to the position of the digit in the number. The total charge is subsequently transferred to a common output charge storage element by way of separate transfer switching elements to produce a voltage that corresponds to the sum of the charge transferred and is, therefore, an analog voltage that corresponds to the binary number.

7 Claims, 9 Drawing Figures

DIGITAL-TO-ANALOG CONVERTER CIRCUIT

BACKGROUND OF THE INVENTION

1. Field of the Invention

This invention relates to digital-to-analog converter circuits and, particularly, to a circuit in which digital input signals are first converted to corresponding quantities of electric charge and stored in separate storage elements and are then later transferred to a common output charge storage element to produce an analog output voltage that corresponds to the sum of the charges transferred. More particularly, the invention relates to a digital-to-analog converter circuit in which metal insulator semiconductor (MIS) field effect transistors or metal oxide semiconductor (MOS) field effect transistors are used as switching elements and as charge transfer elements.

2. Description of the Prior Art

Digital-to-analog converters have become quite important for several kinds of data handling apparatus and a number of different kinds of such converters have become known. Such converters usually utilize a plurality of resistors or current sources composed of bipolar transistors, the number of which corresponds to that of the input digital bits of the digital number. The value of each resistor or the value of the current from each of the current sources is weighted in accordance with the digital code of the input signals. For example, these values may be related according to the sequence 1, 2, 4, 8, 16 ..., so that when the resistors or current sources are switched in response to the digital input signals, they combine to form an analog value by which an analog output signal is derived.

However, converters in which resistors are used are difficult to construct in an integrated circuit because the resistance value of each resistor or at least the ratio of the values must be precisely selected. Those converters using current sources composed of bipolar transistors are complicated and are also difficult to construct in the form of an integrated circuit especially when other circuits such as logic circuits containing a number of MIS or MOS transistors are to be formed on the same integrated circuit chip.

Accordingly, it is one object of this invention to provide an improved digital-to-analog converter circuit that utilizes means other than resistors or current sources of specifically related magnitudes to achieve the desired signal conversion.

It is another object of this invention to provide a digital-to-analog converter circuit utilizing electric charge transfer as the medium for converting from digital input information to analog output information.

A still further object of the present invention is to provide a digital-to-analog converter circuit for construction in integrated circuit form.

Another object of the present invention is to provide a digital-to-analog converter circuit in which MIS or MOS field effect transistors are used as switching elements and charge transfer elements.

BRIEF DESCRIPTION OF THE INVENTION

A number of charge storage elements such as capacitors with capacitance related in the order of *c*, 2*c*, 4*c*, 8*c*, 16*c*,.... are connected to individual input terminals by corresponding individual switching means such as MIS or MOS field effect transistors. The same storage means are also connected to a common terminal by a set of individual charge transfer elements, each connected between one of the capacitors and a common terminal. A second charge storage element in the form of a capacitor having a capacitance at least equal to the sum of the first-mentioned charge storage elements is connected to the common terminal.

An electric signal in binary form and corresponding to a binary number is applied to the input terminals so that each digit of the binary number signal voltage is applied to one of the terminals. A first actuating signal in the form of an electric pulse is applied to all of the gate electrodes of the switching elements to make them conductive at the same time. When the switching elements all become conductive, these binary signals are applied to the capacitors to charge them according to whether the particular binary digit is a 1 or a 0. The actual charge that gets stored in this way on each of the capacitors is directly proportional to the capacitance. The same voltage signal that operates the switching elements also supplies a charge to the second charge storage element. After the charge storage elements have all received their respective charges, the switching elements are made non-conductive and then all of the charge transfer elements are made conductive to connect the capacitors on which the input information has been recorded in the form of a stored charge to the second charge storage element. As a result, the common terminal between the second charge storage element and the charge transfer elements shifts to a voltage that corresponds to the total charge stored from the incoming signals. This voltage is, therefore, an analog of the digital input signal and is connected to a sampling gate circuit where it is sampled and transmitted to an output terminal as the analog equivalent of the incoming digital signal.

DETAILED DESCRIPTION OF THE INVENTION

Figure 1:
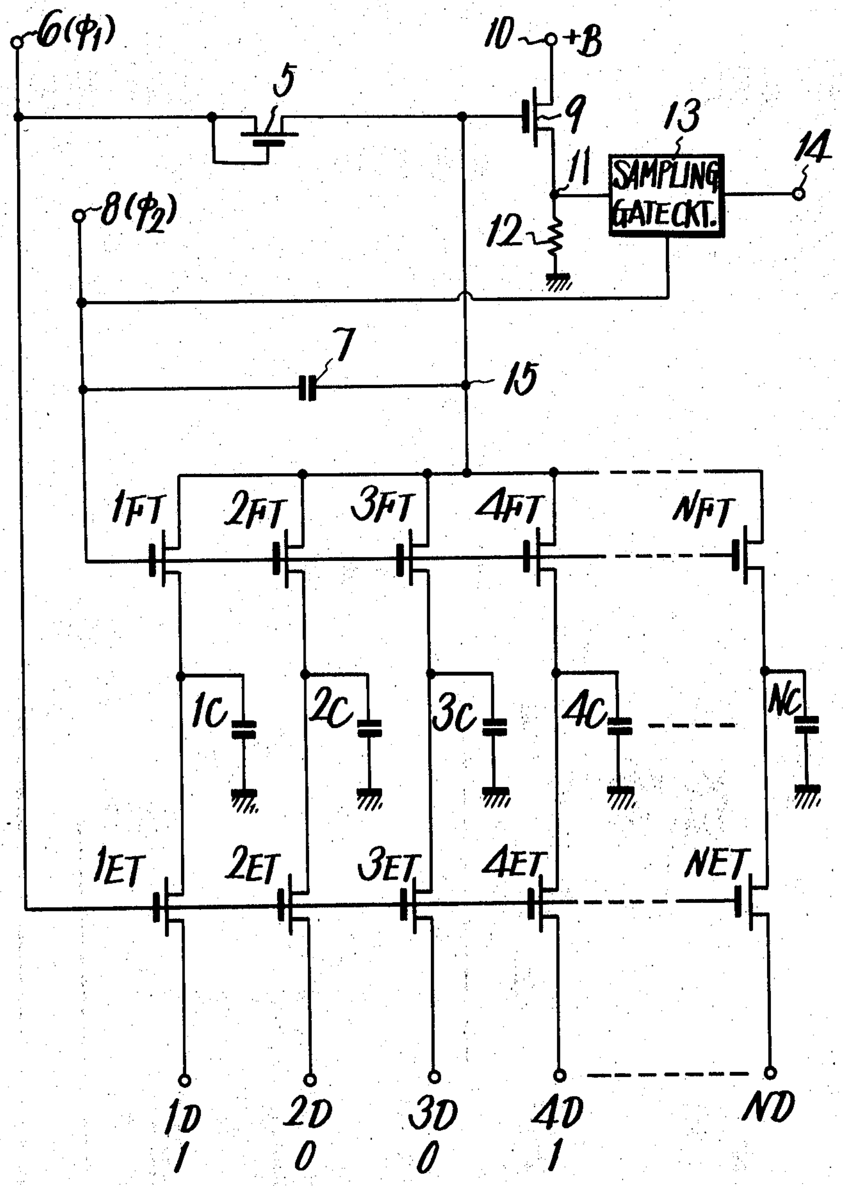
FIG. 1 is a schematic circuit diagram showing one embodiment of a digital-to-analog converter circuit according to the present invention.

The circuit shown in FIG. 1 has a number of input terminals 1D, 2D, 3D, 4D,.... ND, wher N represents a positive integer. These terminals receive the individual integers of a binary number as represented by a bwnary electric signal. Each of the input terminals is connected to a respective switching element in the form of a MIS or MOS field effect transistor 1ET, 2ET, 3ET, 4ET,.... NET. In each instance, the input erminal is connected to one of the source-drain electrodes of the respective field effect transistor, hereinafter referred to as a FET in accordance with standard engineering practice. The other of the source-drain electrodes of each of the FETs 1ET-NET is connected to one terminal of a corresponding capacitor 1C, 2C, 3C, 4C,.... NC. The other terminal of each of these capacitors is grounded and these capacitors comprise a set of first charge storage elements to store charges according to the binary signals presented to the input terminals 1D-ND. The relationship of the capacitances of the capacitors 1C-NC is such that the capacitance of capacitor 4C is twice that of the capacitor 3C, four times that of capacitor 2C, eight times that of capacitor 1C, etc.

The gate electrodes of all of the switching element FETs 1ET-NET are directly connected together to a terminal 6 to which a pulse signal $\phi_1$ is applied. This terminal is also connected through the source-drain electrodes of a FET 5, which acts as a switching element, to the gate electrode of another FET 9. The same electrode of the FET 5 that is connected to the gate electrode of the FET 9 is also connected to a terminal 15 that forms one terminal of a capacitor 7. The latter is also referred to as a second charge storage element. In addition, the terminal 15 is connected by way of the source-drain electrodes of another set of FETs 1FT, 2FT, 3FT,.... NFT to the respective capacitors 1C-NC.

All of the gate electrodes of the FETs 1FT-NFT are directly connected together to another input terminal 8 to which a second pulse signal $\phi_2$ is applied. The same terminal 8 is connected to the other side of the capacitor 7 from the terminal 15 and is connected to the gating portion of a sampling gate circuit 13. The sampling gate circuit receives an analog input signal from the terminal 15 by way of a FET 9 connected as a source (or drain) follower. The drain (or source) 10 of the FET 9 is connected to a power supply terminal and the source (or drain) electrode 11 is connected to ground through a load resistor 12. The electrode 11 is also connected to the input of the sampling gate circuit 13. The output of the sampling gate circuit is connected to an output terminal 14. The sampling gate circuit 13 acts as a means for detecting the amount of electric charge stored in the second charge storage element 7.

The operation of the circuit in FIG. 1 will be described in conjunction with the waveforms shown in FIGS. 2A-2H. With respect to those waveforms, a complete cycle of operation covers the time period from $t_1$ to $t_5$ at which time a new cycle starts.

In the operation of the circuit signals corresponding to the individual digits of a binary number are applied simultaneously to the input terminals 1D-ND. In order to simplify the description, it is sufficient to consider that only a four digit binary number 1001 is applied to the terminals 1D-4D. As is well known, the binary number 1001 corresponds to the decimal number 9. Each of the digits of the binary number is either a 1 or a 0, and in the case of the signal voltage representing the binary number 1001 applied to the input terminals 1D-4D during the internval $t_1$ and $t_2$, the 0 level is indicated in FIGS. 2D-2G as being equal to a voltage level $V_H$ and the 1 level is indicated as being equal to a voltage level $V_L$ which is shown as being negative with respect to $V_H$. More specifically, the binary input signal applied to the input terminal 1D is 1, the signal applied to the input terminal 2D is 0, the input signal applied to the terminal 3D is 0, and the input signal applied to the input terminal 4D is 1.

Figures 2A, 2B, 2C, 2D, 2E, 2F, 2G, 2H:
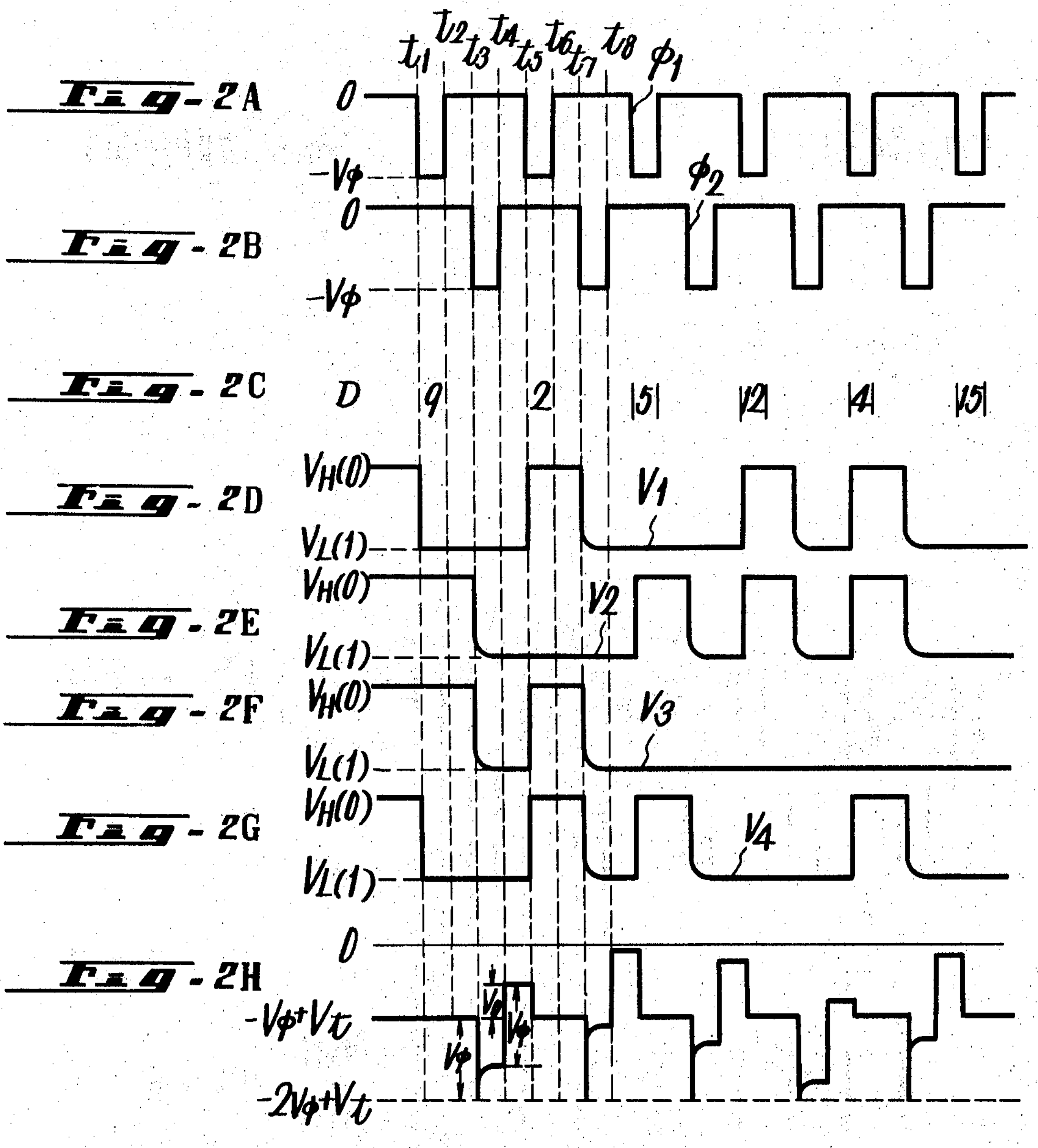
FIGS. 2A-2H represent waveforms typical of those that occur in the operation of the circuit in FIG. 1.

At the time $t_1$ the pulse signal $\phi_1$ is applied to the input terminal 6 to cause all of the switching elements 1ET-4ET to become conductive. This connects all of the capacitors 1C-4C directly to the input terminals 1D-4D, and the capacitors are charged to the respective binary voltage levels. It is to be understood that the binary voltages applied to the input terminals 1D-4D are capable of supplying sufficient charge to change all of the capacitors 1C-4C to the appropriate 1 or 0 voltage level. During the same time interval from $t_1$ to $t_2$, the FET 5 is also made conductive by the signal $\phi_1$ to charge the capacitor 7 to the voltage $-V\phi + V_t$ where $-V\phi$ indicates both the amplitude and polarity of the pulse applied to the terminal 6 and $V_t$ represents the voltage drop across the FET 5) at the terminal 15 of the capacitor 7 as shown in FIG. 2H.

At the time $t_2$ the first pulse in the pulse wave $\phi_1$ comes to an end and all of the switching element FETs 1ET-4ET become non-conductive so that any charge stored on the capacitors 1C-4C is not drained off. The FET 5 also becomes non-conductive at the time $t_2$ and the capacitor 7 is thus kept in its charged condition.

At the time $t_3$ and until the time $t_4$ the first pulse in the pulse wave $\phi_2$ is applied to the terminal 8. The amplitude and polarity of the pulses in the pulse wave $\phi_2$ are the same as in the pulse wave $\phi_1$. As a result, the addition of the voltage $-V\phi$ applied at the terminal 8 to the voltage already present at the terminal 15 makes the voltage at the terminal 15 instantaneously drop to the value $-2V\phi + V_t$ as shown in FIG. 2H. The charge transfer FETs 1FT to 4FT are made conductive at the time $t_3$ by the signal $\phi_2$, so that the charges stored on the capacitors 1C - 4C are transferred through these FETs to shift the potential at the terminal to a voltage level that corresponds to the total amount of charge transferred. The voltage across each of the capacitors 1C - 4C, which was either $V_L$ or $V_H$, becomes equal to the voltage $V_X$, which is the same for all and is substantially equal to the voltage at the terminal 15. The amount of charge transferred by each of the capcacitors 1C - 4C during the interval from $t_3$ to $t_4$ is the capacitance of the respective capacitor times the voltage across it. That voltage was either $V_H - (V\phi - V_t)$ or $V_L - (V\phi - V_t)$, depending on whether the voltage stored on the capacitor corresponded to a binary 1 or a binary 0. The capacitance of the capacitor 7 is equal to or greater than the sum of capacitances of the capacitors 1C - 4C.

As stated previously, the capacitance of each of the capacitors 1C - 4C is weighted according to the sequence 1, 2, 4, and 8, so that the value of the total charge transferred from the capacitor 7 during the interval from $t_3$ to $t_4$ represents the analog signal corresponding to the binary coded signal at the input terminals 1D - 4D during the interval from $t_1$ to $t_2$. The potential at the terminal 15 just prior to the time $t_4$ is the analog of the binary input signal. If the sampling gate circuit 14 is opened by the signal $\phi_2$ during the time interval from $t_3$ to $t_4$, the potential of an output signal that corresponds to the analog signal can be obtained at the output terminal 14.

A low-pass filter may be employed in place of the sampling gate circuit 13. The shifting of the voltage level of the terminal 15 to the value $V_o$ during the interval from $t_4$ to $t_5$ as shown in FIG. 2H would be undesirable. However, the adverse effect of this shift could be minimized by making the time duration between the pulses of the signals $\phi_1$ and $\phi_2$ short enough.

The cycle is complete at the time $_5$ and the circuit is ready to produce the analog equivalent of another digital input signal. FIG. 2C - 2H show the relationships that would exist for producing analog voltages equivalent to the binary numbers: 10, which equals the decimal number 2; 101, which equals decimal number 5; 1100, which equals decimal number 12; 100, which equals decimal number 4; and 1111, which equals decimal number 15. Although the operation of the circuit has only been described with reference to the components connected to four binary input terminals 1D - 4D, additional binary input terminals up to the full number ND could be used, if desired. The extra switching element FETs up to the FET NET and extra capacitors up to capacitor NC and extra charge transfer FETs up to FET would, of course, be required to accomodate larger binary numbers.

The digital-to-analog converter circuit permits simplified construction using MIS FETs or MOS FETs, which are also used in many kinds of logic circuits. This means that the digital-to-analog converter circuit of the present invention can conveniently be formed on the same semiconductor substrate with other logic circuits as an integrated circuit.

What we claim is:

1. A digital-to-analog converter circuit comprising:

N input terminals N being equal to at least two adapted to each receive an electrical signal of a respective digit of a digitally coded number;

N first charge storage means each having a weighted capacity to store an electric charge;

N switching elements each connected between one of said input terminals and a corresponding one of said first charge storage means;

second charge storage means connected between first and second terminals and having a capacity sufficient to store the total of the electrical charges stored by said N first charge storage means;

N charge transfer elements each connected between a corresponding one of said first charge storage means and said first terminal of said second charge storage means;

means for applying a first series of pulses to said switching elements so as to actuate the latter during a first interval for charging each of said first charge storage means to a voltage corresponding to the digital signal applied to the respective one of said input terminals during said first interval;

means for also applying said first series of pulses to said first terminal of said second charge storage means to charge the latter to a voltage which corresponds substantially to the voltage of the pulses during said first interval;

means for applying to said second terminal of said second charge storage means a second series of pulses lagging behind the pulses of said first series; and means for also applying said second series pulses to said charge transfer elements for actuating the latter during a second interval which follows said first interval and during which there is transferred through the actuated charge transfer elements between said first and second charge storage means a charge corresponding to the total charge previously established on said first charge storage means for producing, at said first terminal of said second charge storage means, a voltage having an analog value corresponding to said digitally coded number.

2. The digital-to-analog coverter of claim 1; in which each of said switching elements comprises a respective FET of a first set of FETs which receive said first series of pulses to make all of the FETs of said first set conductive simultaneously, and each of said charge transfer elements comprises a respective FET of a second set of FETs which receive said second series of pulses lagging behind the pulses of said first series to make all of the FETs of said second set conductive simultaneously after said FETs of said first set have become non-conductive.

3. The digital-to-analog circuit of claim 2, further comprising a sampling gate circuit connected to said first terminal of the second charge storage means to receive the analog voltage thereat, and means applying said second series of pulses to said gate circuit to actuate the same.

4. The digital-to-analog converter circuit of claim 1 in which each of said N first charge storage means has a storage capacity weighted in predetermined correspondence with the code of said digital-coded number.

5. The digital-to-analog converter circuit of claim 4 in which the storage capacity of said N first charge storage means is weighted according to the sequence 1, 2, 4, 8,...$(2^N)/2$.

6. The digital-to-analog converter circuit of claim 4 in which each of said N first charge storage means comprises a capacitor having a capacitance weighted in correspondence with the code of said digitally coded number.

7. The digital-to-analog converter circuit of claim 6 in which the capacitance of said capacitors is related such that a first one of said capacitors has: a capacitance equal to $(2^N)/2$ times the capacitance of each of the other of said capacitors in sequence.

* * * * *